United States Patent
Lee et al.

(10) Patent No.: US 9,779,969 B2
(45) Date of Patent: Oct. 3, 2017

(54) PACKAGE STRUCTURE AND MANUFACTURING METHOD

(71) Applicant: Taiwan Semiconductor Manufacturing Co., Ltd, Hsin-Chu (TW)

(72) Inventors: Li-Guo Lee, Taipei (TW); Yung-Sheng Liu, Hsinchu (TW); Yi-Chen Liu, Zhubei (TW); Yi-Jen Lai, Hsinchu (TW); Chun-Jen Chen, Jhubei (TW); Hsi-Kuei Cheng, Zhubei (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 168 days.

(21) Appl. No.: 14/209,023

(22) Filed: Mar. 13, 2014

(65) Prior Publication Data

US 2015/0262846 A1    Sep. 17, 2015

(51) Int. Cl.
*H01L 23/00* (2006.01)
*H01L 21/56* (2006.01)

(52) U.S. Cl.
CPC .......... *H01L 21/563* (2013.01); *H01L 24/05* (2013.01); *H01L 24/13* (2013.01); *H01L 24/03* (2013.01);
(Continued)

(58) Field of Classification Search
CPC ......... H01L 24/05; H01L 24/06; H01L 24/10; H01L 24/13; H01L 24/32; H01L 24/81; H01L 24/82; H01L 24/03; H01L 24/11; H01L 24/16; H01L 21/563; H01L 23/3142; H01L 2224/0345; H01L 2224/03452;
(Continued)

(56) References Cited

U.S. PATENT DOCUMENTS 6,596,619 B1 * 7/2003 Wang ................. H01L 24/03
257/E21.508
8,067,308 B2 * 11/2011 Suthiwongsunthorn
.......................... H01L 21/486
257/E21.006

(Continued)

FOREIGN PATENT DOCUMENTS

TW    200937547    9/2009
TW    201407734    2/2014

OTHER PUBLICATIONS

Chinese language office action dated Jan. 20, 2016, issued in application No. TW 103145157.

(Continued)

*Primary Examiner* — Cheung Lee
*Assistant Examiner* — Stephen C Smith
(74) *Attorney, Agent, or Firm* — McClure, Qualey & Rodack, LLP (57) ABSTRACT

A package structure and a manufacturing method are provided. The package structure includes a semiconductor substrate and a first conductive feature over the semiconductor substrate. The package structure also includes a substrate and a second conductive feature over the substrate. The second conductive feature is bonded with the first conductive feature through a bonding structure. The package structure further includes a protection material surrounding the bonding structure, and the protection material is in direct contact with a side surface of the first conductive feature.

20 Claims, 11 Drawing Sheets

(52) U.S. Cl.
CPC ............... *H01L 24/11* (2013.01); *H01L 24/16* (2013.01); *H01L 24/81* (2013.01); *H01L 2224/0345* (2013.01); *H01L 2224/0362* (2013.01); *H01L 2224/03452* (2013.01); *H01L 2224/03912* (2013.01); *H01L 2224/0401* (2013.01); *H01L 2224/05016* (2013.01); *H01L 2224/05023* (2013.01); *H01L 2224/0558* (2013.01); *H01L 2224/05124* (2013.01); *H01L 2224/05147* (2013.01); *H01L 2224/05155* (2013.01); *H01L 2224/05166* (2013.01); *H01L 2224/05558* (2013.01); *H01L 2224/05562* (2013.01); *H01L 2224/05564* (2013.01); *H01L 2224/05568* (2013.01); *H01L 2224/05655* (2013.01); *H01L 2224/05666* (2013.01); *H01L 2224/1145* (2013.01); *H01L 2224/1147* (2013.01); *H01L 2224/11452* (2013.01); *H01L 2224/11462* (2013.01); *H01L 2224/11849* (2013.01); *H01L 2224/13006* (2013.01); *H01L 2224/13111* (2013.01); *H01L 2224/13124* (2013.01); *H01L 2224/13144* (2013.01); *H01L 2224/13147* (2013.01); *H01L 2224/13155* (2013.01); *H01L 2224/13166* (2013.01); *H01L 2224/13169* (2013.01); *H01L 2224/1607* (2013.01); *H01L 2224/16238* (2013.01); *H01L 2224/73204* (2013.01); *H01L 2224/81191* (2013.01); *H01L 2224/81203* (2013.01); *H01L 2224/81815* (2013.01); *H01L 2224/92125* (2013.01); *H01L 2924/13091* (2013.01)

(58) Field of Classification Search
CPC ... H01L 2224/0362; H01L 2224/03912; H01L 2224/0401; H01L 2224/05016; H01L 2224/05023; H01L 2224/05124; H01L 2224/05146; H01L 2224/05155; H01L 2224/05166; H01L 2224/05558; H01L 2224/05562; H01L 2224/05564; H01L 2224/05568; H01L 2224/0558; H01L 2224/05655; H01L 2224/05666; H01L 2224/1145; H01L 2224/11452; H01L 2224/11462; H01L 2224/1147; H01L 2224/11849; H01L 2224/13006; H01L 2224/13111; H01L 2224/13124; H01L 2224/13144; H01L 2224/13147; H01L 2224/13155; H01L 2224/13166; H01L 2224/13169; H01L 2224/1607; H01L 2224/16238; H01L 2224/73204; H01L 2224/81191; H01L 2224/81203; H01L 2224/81815; H01L 2224/92125; H01L 2924/13091

See application file for complete search history.

(56) References Cited

U.S. PATENT DOCUMENTS

| | | | | |
|---|---|---|---|---|
| 8,288,871 | B1* | 10/2012 | Shieh | H01L 23/49838 257/737 |
| 8,294,279 | B2* | 10/2012 | Chen | H01L 21/563 257/686 |
| 8,669,173 | B2* | 3/2014 | Lee | H01L 21/4846 257/780 |
| 9,064,757 | B2* | 6/2015 | Gregorich | H01L 24/13 |
| 2002/0121692 | A1* | 9/2002 | Lee | H01L 24/05 257/737 |
| 2009/0152719 | A1 | 6/2009 | Lee | |
| 2009/0197114 | A1* | 8/2009 | Shih | B23K 1/0016 428/647 |
| 2010/0264541 | A1* | 10/2010 | Lee | H01L 21/4846 257/738 |
| 2011/0193219 | A1* | 8/2011 | Lai | H01L 24/16 257/737 |
| 2011/0233761 | A1* | 9/2011 | Hwang | H01L 24/03 257/737 |
| 2012/0248601 | A1* | 10/2012 | Anderson | H01L 24/11 257/737 |
| 2012/0261812 | A1* | 10/2012 | Topacio | H01L 24/03 257/737 |
| 2013/0026623 | A1* | 1/2013 | Chen | H01L 23/16 257/737 |
| 2013/0221536 | A1* | 8/2013 | Gregorich | H01L 24/13 257/774 |
| 2014/0138831 | A1* | 5/2014 | Jomaa | H01L 21/563 257/750 |

OTHER PUBLICATIONS

Chinese language office action dated Jun. 17, 2016, issued in application No. TW 103145157.

* cited by examiner

PACKAGE STRUCTURE AND MANUFACTURING METHOD

BACKGROUND

Semiconductor devices are used in a variety of electronic applications, such as personal computers, cell phones, digital cameras, and other electronic equipment. The fabrication of semiconductor devices involves sequentially depositing insulating or dielectric layers, conductive layers, and semiconductor layers over a semiconductor substrate, and patterning the various material layers using lithography and etching processes to form circuit components and elements on the semiconductor substrate.

The semiconductor industry continues to improve the integration density of various electronic components (e.g., transistors, diodes, resistors, capacitors, etc.) by continual reductions in minimum feature size, which allows more components to be integrated into a given area. The number of input and output (I/O) connections is significantly increased. Smaller package structures, that utilize less area or smaller heights, are developed to package the semiconductor devices.

New packaging technologies have been developed to improve the density and functions of semiconductor devices. These relatively new types of packaging technologies for semiconductor devices face manufacturing challenges.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the performance of a first process before a second process in the description that follows may include embodiments in which the second process is performed immediately after the first process, and may also include embodiments in which additional processes may be performed between the first and second processes. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
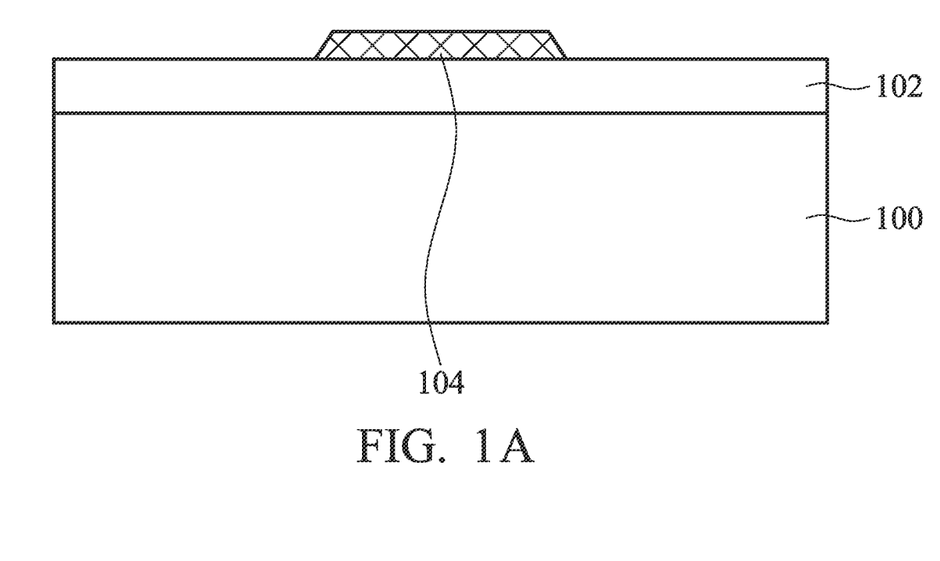
FIGS. 1A-1I are cross-sectional views of various stages of a process for forming a package structure, in accordance with some embodiments.

FIGS. 1A-1I are cross-sectional views of various stages of a process for forming a package structure, in accordance with some embodiments. Referring to FIG. 1A, a semiconductor substrate 100 is provided. In some embodiments, the semiconductor substrate 100 is a semiconductor wafer (such as a silicon wafer) or a portion of a semiconductor wafer. In some embodiments, the semiconductor substrate 100 includes an elementary semiconductor material including silicon or germanium in a single crystal, polycrystal, or amorphous structure. In some other embodiments, the semiconductor substrate 100 includes a compound semiconductor, such as silicon carbide, gallium arsenide, gallium phosphide, indium phosphide, indium arsenide, an alloy semiconductor, such as SiGe, GaAsP, AlInAs, AlGaAs, GaInAs, GaInP, GaInAsP, or a combination thereof. In some embodiments, the semiconductor substrate 100 includes multi-layer semiconductors, a semiconductor on insulator (SOI) (such as silicon on insulator or germanium on insulator), or a combination thereof.

In some embodiments, the semiconductor substrate 100 includes isolation features (not shown). The isolation features may define and isolate various device elements formed in the semiconductor substrate 100. The isolation features include shallow trench isolation (STI) features, local oxidation of silicon (LOCOS) features, other suitable isolation features, or a combination thereof.

Examples of the various device elements, which may be formed in the semiconductor substrate 100, include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, other applicable elements, or a combination thereof.

As shown in FIG. 1A, a dielectric layer 102 is formed over the semiconductor substrate 100, in accordance with some embodiments. In some embodiments, various conductive features are formed in the dielectric layer 102. In some embodiments, the conductive features include multiple horizontal interconnects, such as conductive lines, and multiple vertical interconnects, such as conductive vias or conductive contacts. In some embodiments, the dielectric layer 102 is a stack of multiple dielectric layers. The conductive features formed in the dielectric layer 102 form conductive paths between the device elements (not shown) formed in or on the semiconductor substrate 100 and conductive traces over the dielectric layer 102. The device element may be a doped region formed in or over the semiconductor substrate 100. Alternatively, the device element may be a gate electrode formed over or in the semiconductor substrate 100. Multiple conductive lines and conductive vias (not shown) may be formed in the dielectric layer to form conductive paths to the device elements. The dielectric layer 102 and the conductive features may together form an interconnect structure over the semiconductor substrate 100.

As shown in FIG. 1A, a conductive feature 104 is formed over the dielectric layer 102 over the semiconductor substrate 100, in accordance with some embodiments. In some embodiments, the conductive feature 104 includes a conductive trace and a conductive pad which are electrically connected with each other. In some embodiments, the conductive feature 104 is also referred to as a top metal. In some embodiments, the conductive feature 104 is electrically connected to one of the device elements in the semiconductor substrate 100 through some of the conductive features in the dielectric layer 102. In some embodiments, FIG. 1A shows a cross-sectional view of the conductive pad of the conductive feature 104. In some other embodiments, FIG. 1A shows a cross-sectional view of the conductive trace of the conductive feature 104.

In some embodiments, the conductive feature 104 is made of AlCu, Al, Cu, other suitable material, or a combination thereof. In some embodiments, the conductive feature 104 is formed by patterning a conducting layer deposited over the dielectric layer 102. For example, the conductive layer is patterned using a photolithography process and an etching process to form multiple conductive features including the conductive feature 104.

In some embodiments, the dielectric layer 102 is made of silicon oxide, silicon nitride, silicon oxynitride, tetraethylorthosilicate (TEOS) oxide, phosphosilicate glass (PSG), borophosphosilicate glass (BPSG), fluorinated silica glass (FSG), carbon doped silicon oxide, amorphous fluorinated carbon, low-k dielectric material, other suitable materials, or a combination thereof. In some embodiments, the conductive features formed in the dielectric layer 102 are made of copper, aluminum, tungsten, titanium, nickel, gold, platinum, other suitable material, or a combination thereof. A number of deposition, photolithography, and etching processes may be performed to form the dielectric layer 102 and the conductive features therein.

As shown in FIG. 1A, there is no passivation layer (such as a silicon nitride layer, silicon oxide layer, silicon oxynitride layer, or the like) formed on the conductive feature 104, in accordance with some embodiments. That is, no passivation layer is formed to cover the dielectric layer 102 and the conductive feature 104 in some embodiments. In some embodiments, deposition and patterning processes for forming the passivation layer is not needed. Therefore, fabrication cost and fabrication time are reduced.

Figure 1B:
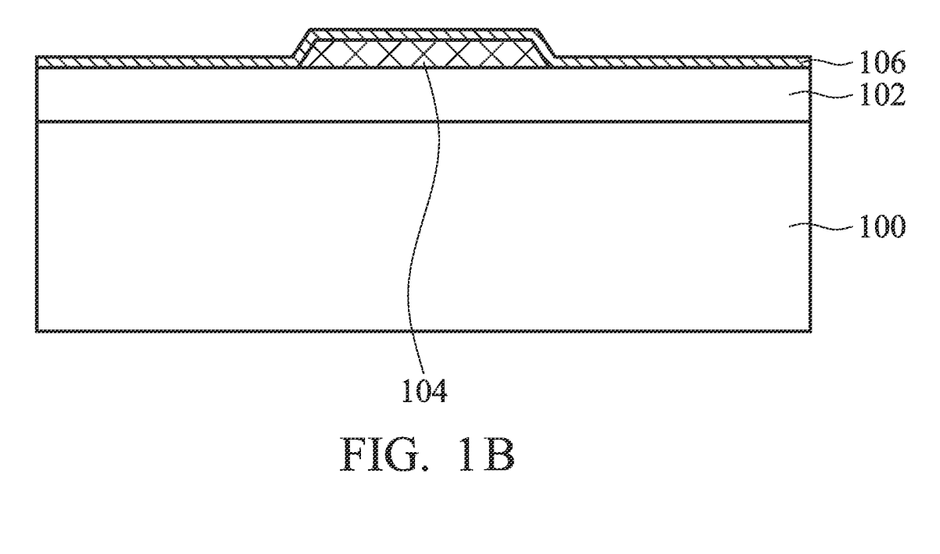

As shown in FIG. 1B, an under-bump metallization (UBM) layer 106 is deposited over the dielectric layer 102 and the conductive feature 104, in accordance with some embodiments. In some embodiments, the UBM layer 106 is a single layer or a stack of multiple layers. For example, the UBM layer 106 may be made of Ti, TiW, TiCu, Ni, other suitable material, or a combination thereof. In some embodiments, the UBM layer 106 includes sub-layers including, for example, a diffusion barrier layer and a seed layer. The diffusion barrier layer may be formed of tantalum nitride, although it may also be formed of other materials such as titanium nitride, tantalum, titanium, or the like. The seed layer may be a copper seed layer formed on the diffusion barrier layer. The copper seed layer may be formed of copper or one of many copper alloys that include silver, chromium, nickel, tin, gold, or a combination thereof. In some embodiments, the UBM layer 106 is deposited by using a physical vapor deposition (PVD) process, a chemical vapor deposition (CVD) process, an electroplating process, a spin-on process, other applicable process, or a combination thereof.

Figure 1C:
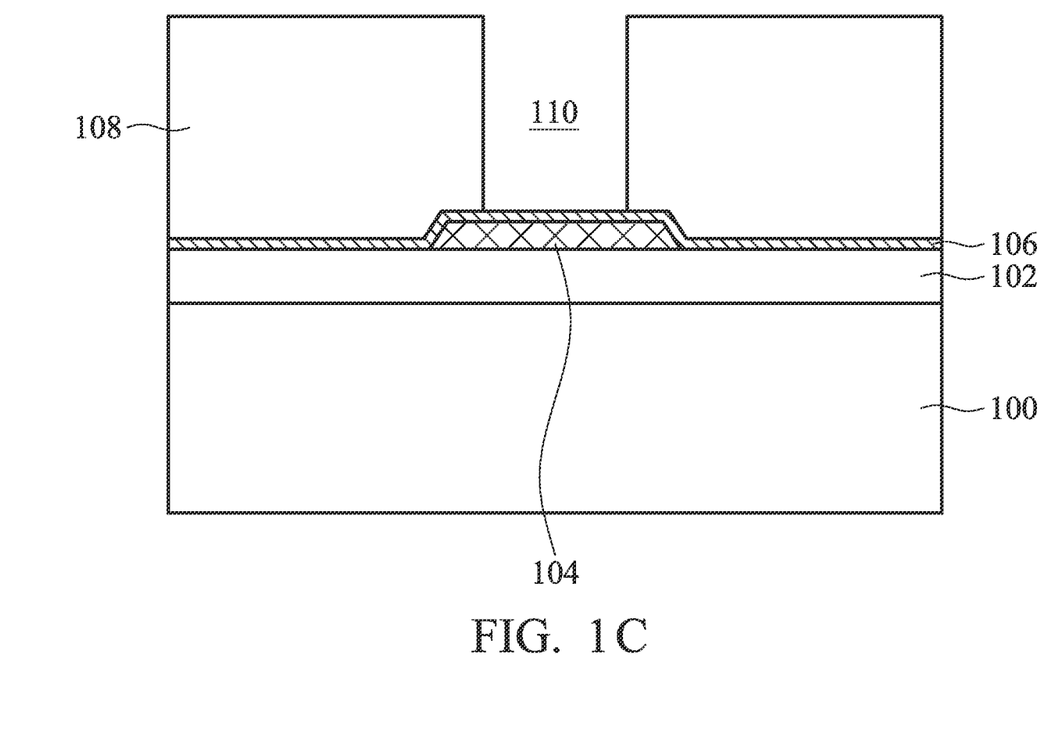

As shown in FIG. 1C, a mask layer 108 is formed over the UBM layer 106, in accordance with some embodiments. The mask layer 108 has one or more openings including an opening 110. In some embodiments, the opening 110 exposes a portion of the UBM layer 106 above the conductive feature 104. In some embodiments, the mask layer 108 is a photoresist layer. In some embodiments, the mask layer 108 is formed by using a lithography process involving one or more masking, exposing, baking, developing, and rinsing processes (not necessarily in that order).

Figure 1D:
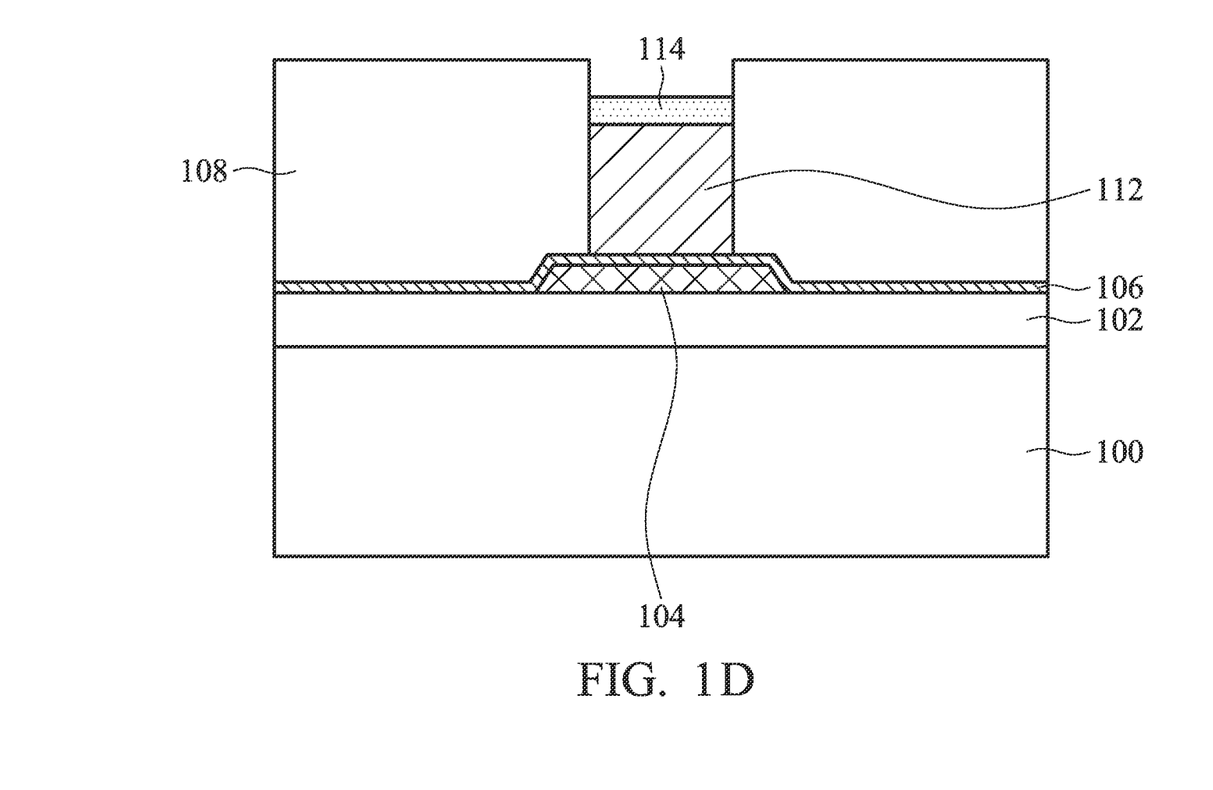

As shown in FIG. 1D, a conductive pillar 112 is deposited over the UBM layer 106 exposed by the opening 110 of the mask layer 108, in accordance with some embodiments. In some embodiments, the conductive pillar 112 is made of copper (Cu), gold (Au), platinum (Pt), titanium (Ti), nickel (Ni), aluminum (Al), other suitable material, or a combination thereof. In some embodiments, the conductive pillar 112 is formed using an electroplating process, a PVD process, a CVD process, other applicable processes, or a combination thereof. In some embodiments, the UBM layer 106 is also used as an electroplating seed layer. A suitable conductive material, such as copper, is electroplated on the UBM layer 106 to form the conductive pillar 112.

As shown in FIG. 1D, a solder layer 114 is formed over the conductive pillar 112, in accordance with some embodiments. The solder layer 114 includes tin (Sn) and may contain lead or may be lead free. In some embodiments, the solder layer 114 includes tin (Sn) and other material including lead (Pb), silver (Ag), bismuth (Bi), copper (Cu), gold (Ag), aluminum (Al), arsenic (As), iron (Fe), nickel (Ni), antimony (Sb), other suitable material, or a combination thereof. In some embodiments, the solder layer 114 is formed using an electroplating process or other applicable processes. In some embodiments, a flux material (not shown) is also formed over the solder layer 114. In some embodiments, the flux material is mixed within the solder layer 114.

Figure 1E:
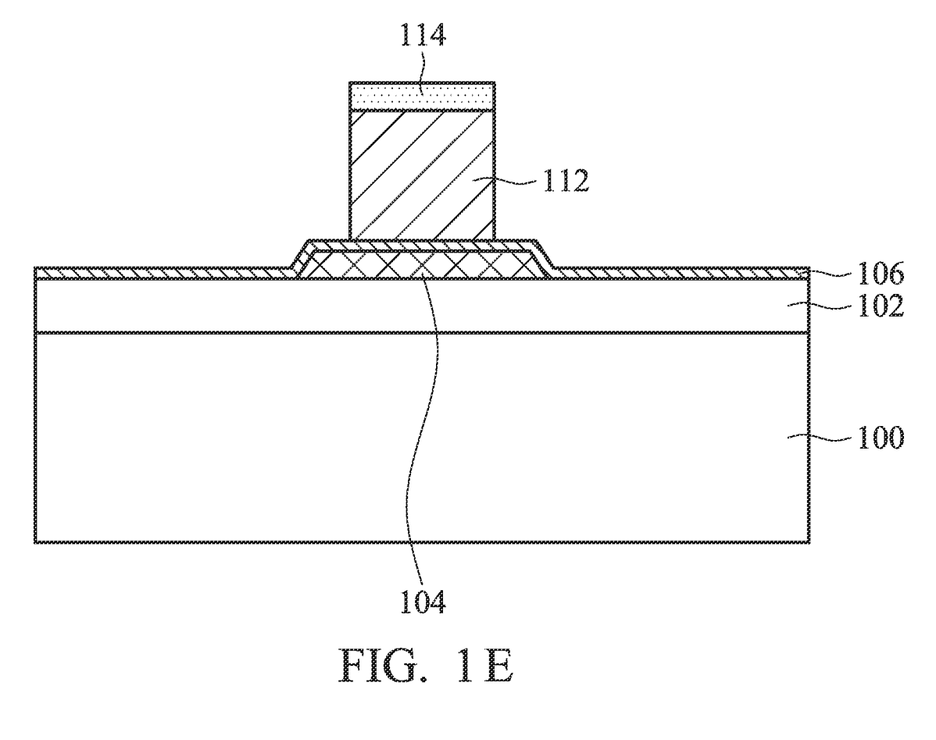

Afterwards, the mask layer 108 is removed, as shown in FIG. 1E in accordance with some embodiments. In some embodiments, the mask layer 108 is removed using a stripping process, an ashing process, other applicable processes, or a combination thereof.

Figure 1F:
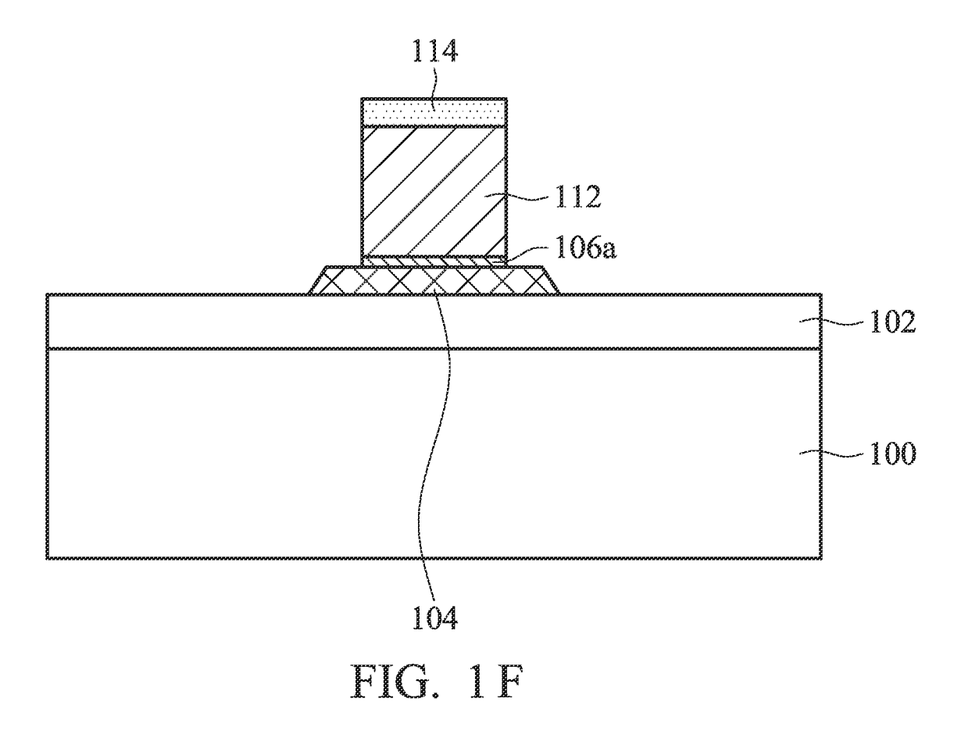

As shown in FIG. 1F, the UBM layer 106 is then patterned to form one or more UBM elements over the semiconductor substrate 100, in accordance with some embodiments. In some embodiments, an UBM element 106a is formed over the conductive feature 104, as shown in FIG. 1F. In some embodiments, the UBM layer 106 is patterned using an etching process. The etching process may include a dry etching process, a wet etching process, or a combination thereof. For example, the solder layer 114 and the conductive pillar 112 are together used as an etching mask. After the etching process, the UBM layer 106 not covered by the etching mask is removed so as to form one or more UBM elements including the UBM element 106a.

Figure 1G:
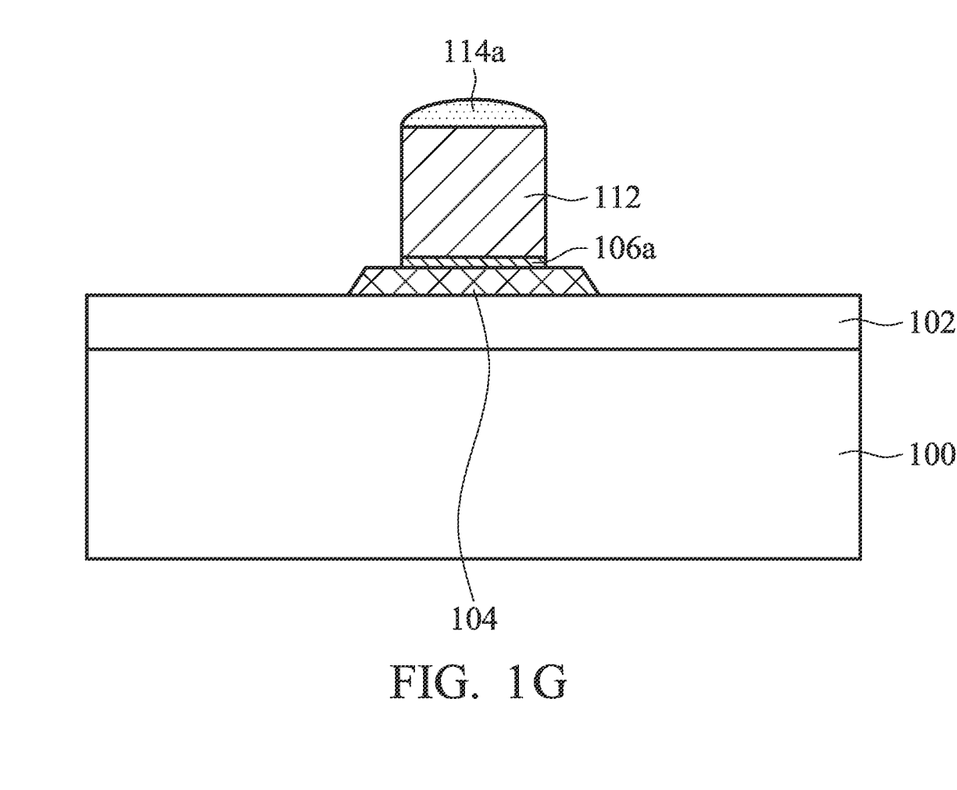

As shown in FIG. 1G, the solder layer 114 is reflowed to form a solder cap 114a over the conductive pillar 112, in accordance with some embodiments. In some embodiments, a flux (not shown) is formed over the solder layer 114 before the reflow process. In some embodiments, the solder layer 114 is reflowed at a reflow temperature ranging from about 180 degrees C. to about 280 degrees C. In some other embodiments, the reflow temperature is in a range from about 220 degrees C. to about 260 degrees C.

Figure 1H:
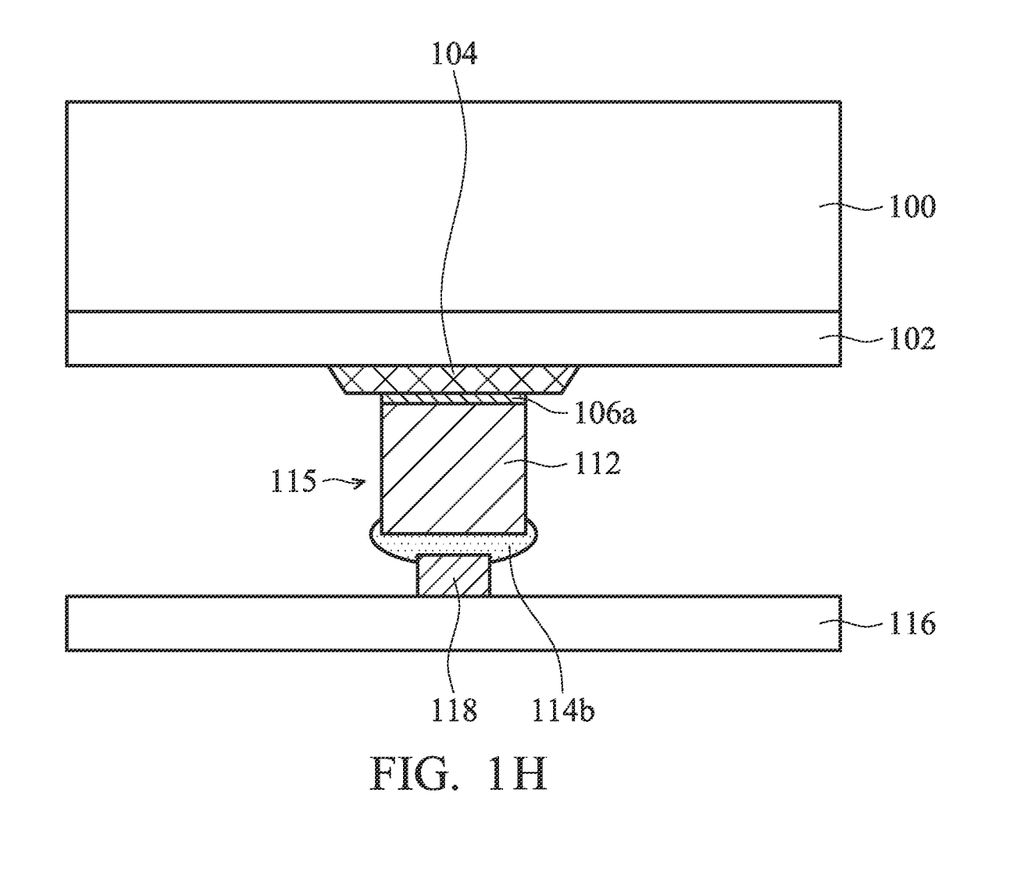

As shown in FIG. 1H, a substrate 116 is provided, in accordance with some embodiments. In some embodiments, the substrate 116 is an organic substrate. In some other embodiments, the substrate 116 is a multiple-layer circuit board. In some embodiments, the substrate 116 includes bismaleimide triazine (BT) resin, FR-4 (a composite material composed of woven fiberglass cloth with an epoxy resin binder that is flame resistant), ceramic, glass, plastic, tape, film, or other supporting materials. In some other embodiments, the substrate 116 is made of a semiconductor material. The substrate 116 may be made of a semiconductor wafer, or a portion of wafer. In some other embodiments, the substrate 116 is a printed circuit board. In some embodiments, the substrate 116 includes silicon, gallium arsenide, silicon on insulator ("SOI") or other similar materials. In some embodiments, the substrate 116 also includes passive devices, such as resistors, capacitors, inductors and the like, or active devices, such as transistors. In some embodiments, the substrate 116 includes additional integrated circuits. The substrate 116 may further include through substrate vias (TSVs) and may be used as an interposer.

In some embodiments, one or more conductive features, including a conductive feature 118, are formed over the substrate 116, as shown in FIG. 1H. In some embodiments, the conductive feature 118 is a conductive trace. In some embodiments, the conductive feature 118 is made of copper, aluminum, gold, platinum, titanium, nickel, other suitable material, or a combination thereof. In some embodiments, a conductive layer is deposited and patterned to form the conductive feature 118.

As shown in FIG. 1H, the structure shown in FIG. 1G is bonded with the substrate 116 to form a package structure, in accordance with some embodiments. In some embodiments, the solder cap 114a is used to bond with the conductive feature 118. As a result, a solder bump 114b is formed between the conductive pillar 112 and the conductive feature 118. In some embodiments, the UBM element 106a, the conductive pillar 112, and the solder bump 114b together form a bonding structure 115. The semiconductor substrate 100 and the substrate 116 are bonded with each other through the bonding structure 115. The UBM element 106a and the solder bump 114b sandwich the conductive pillar 112 in some embodiments.

In some embodiments, the solder cap 114a is directly bonded with the conductive feature 118. In some other embodiments, a solder material and/or a flux (not shown) are/is formed over the conductive feature 118 before the bonding. In some embodiments, the conductive pillar 112 and the conductive feature 118 are bonded together using a thermal compression process, a thermal reflow process, other applicable processes, or a combination thereof.

Figure 1I:
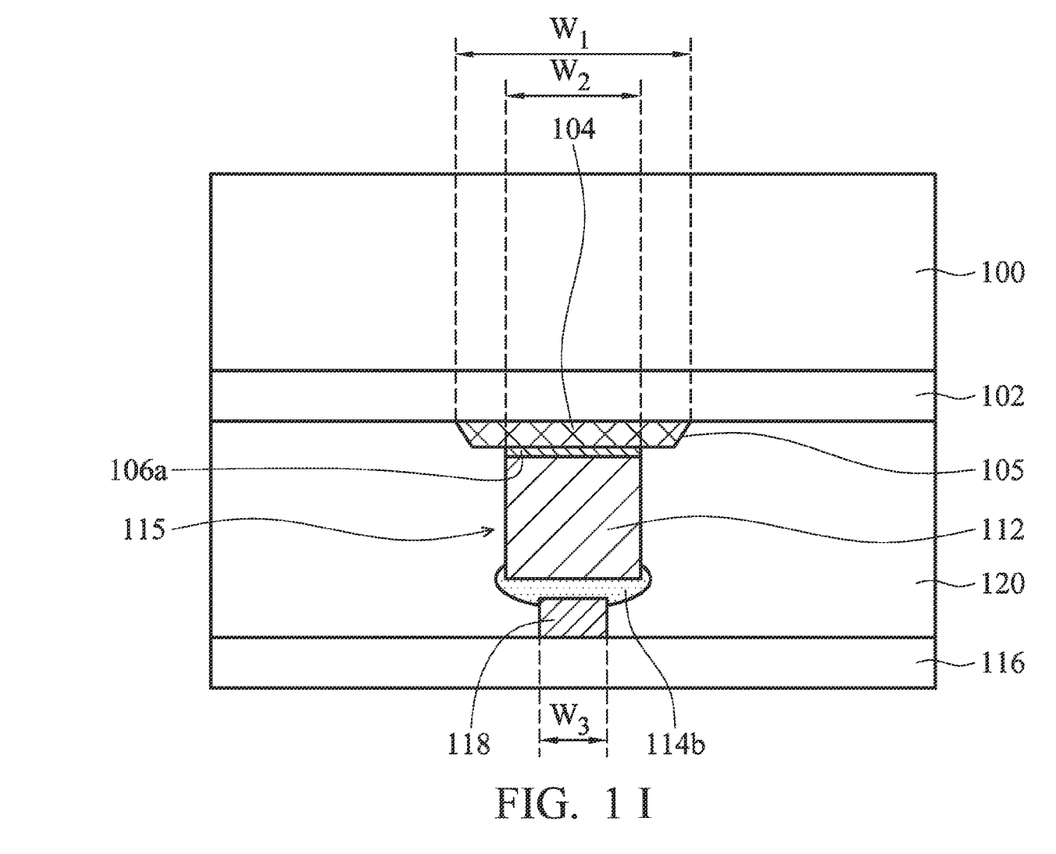

As shown in FIG. 1I, a protection material 120 is formed between the semiconductor substrate 100 and the substrate 116, in accordance with some embodiments. In some embodiments, the protection material 120 surrounds the bonding structure 115. The protection material 120 may be used to protect the bonding structure 115 between the semiconductor substrate 100 and the substrate 116. In some embodiments, the protection material 120 completely fills the space between the semiconductor substrate 100 and the substrate 116. Embodiments of the disclosure have many variations. In some other embodiments, the protection material 120 is not formed.

As shown in FIG. 1I, the protection material 120 surrounds the conductive feature 104, the bonding structure 115, and the conductive feature 118, in accordance with some embodiments. In some embodiments, the protection material 120 is in direct contact with the conductive feature 104, the bonding structure 115, and the conductive feature 118. As shown in FIG. 1I, the conductive feature 104 has a side surface 105. In some embodiments, the protection material 120 is in direct contact with the side surface 105 of the conductive feature 104.

In some embodiments, the protection material 120 includes a resin material such as an epoxy resin, a phenol resin, other suitable material, or a combination thereof. In some embodiments, the protection material 120 includes an underfill material, a non-conductive paste (NCP), or the like. In some embodiments, the protection material 120 is dispensed, flowed, and/or applied between the semiconductor substrate 100 and the substrate 116. In some embodiments, there is no passivation layer formed between the conductive feature 104 and the protection material 120. In some embodiments, there is not any silicon nitride layer, silicon oxide layer, or silicon oxynitride layer formed between the conductive feature 104 and the protection material 120.

As shown in FIG. 1I, the conductive feature 104 has a width $W_1$, the conductive pillar 112 has a width $W_2$, and the conductive feature 118 has a width $W_3$. In some embodiments, the width $W_1$ is larger than the width $W_2$. The conductive feature 104 is wider than the conductive pillar 112. Embodiments of the disclosure are not limited thereto. In some other embodiments, the conductive pillar 112 is wider than the conductive feature 104. In some embodiments, the difference between the widths $W_1$ and $W_2$ is not too much, ensuring that no high stress is formed between the conductive feature 104 and the conductive pillar 112. In some embodiments, a width ratio ($W_1/W_2$) of the conductive feature 104 to the conductive pillar 112 is in a range from about 0.5 to about 2. In some embodiments, the width $W_3$ is in a range from about 15 μm to about 40 μm. In some embodiments, the difference between the widths $W_2$ and $W_3$ is not too much, ensuring that no high stress is formed between the conductive feature 118 and the bonding structure 115 during and/or after the bonding process. In some embodiments, a width ratio $W_3$ ($W_2/W_3$) of the conductive pillar 112 to the conductive feature 118 is in a range from about 0.5 to about 2. In some embodiments, the conductive pillar 112 is wider than the conductive feature 118. The width ratio ($W_2/W_3$) may be in a range from about 1.01 to about 2.

In some embodiments, no passivation layer is formed over the semiconductor substrate 100 to cover the conductive feature 104 before the bonding structure 115 is formed. Deposition and patterning processes for forming the passivation layer is not needed. Therefore, fabrication cost and fabrication time are reduced.

Figure 2:
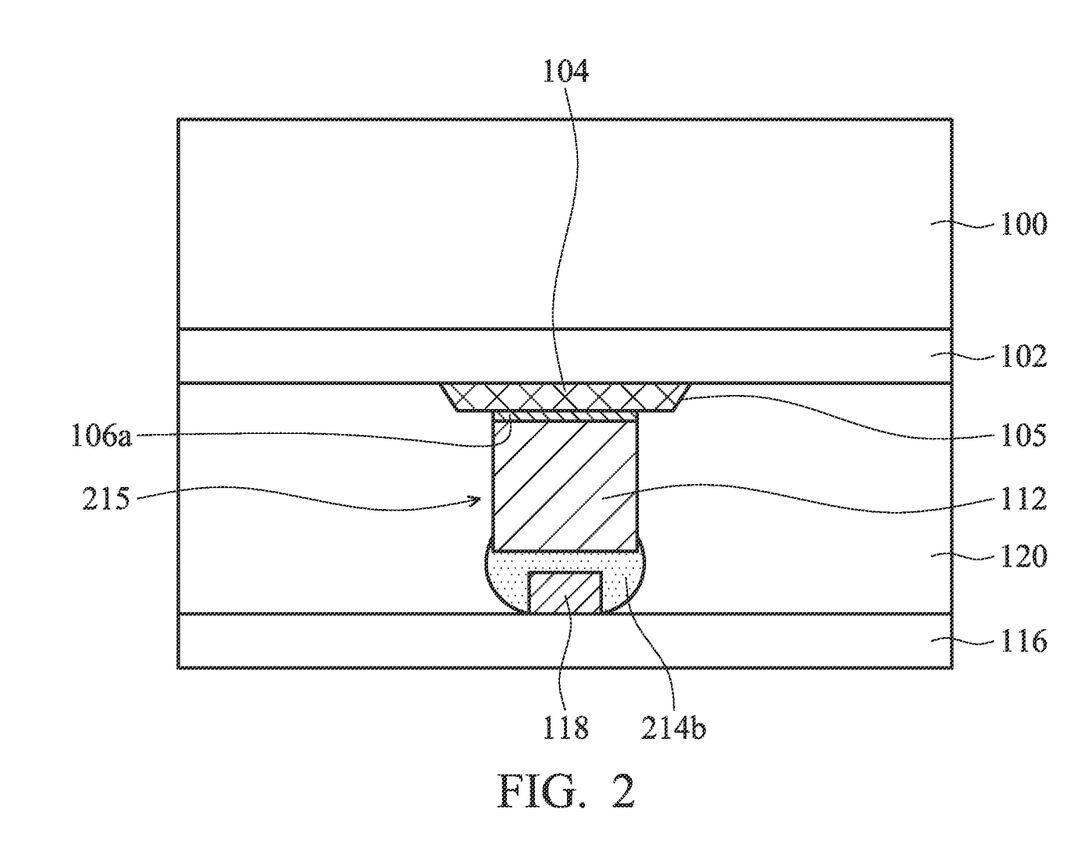
FIG. 2 is a cross-sectional view of a package structure, in accordance with some embodiments.

Embodiments of the disclosure have many variations. FIG. 2 is a cross-sectional view of a package structure, in accordance with some embodiments. The package structure shown in FIG. 2 is similar to that shown in FIG. 1I. The main difference is that a solder bump 214b is formed to cover the conductive feature 118. A bonding structure 215, including the UBM element 106a, the conductive pillar 112, and the solder bump 214b, is formed.

Embodiments of the disclosure have many variations. For example, the UBM element is not limited to being shorter or narrower than the conductive feature thereunder. In some embodiments, the UBM element is wider than the conductive feature thereunder.

Figure 3:
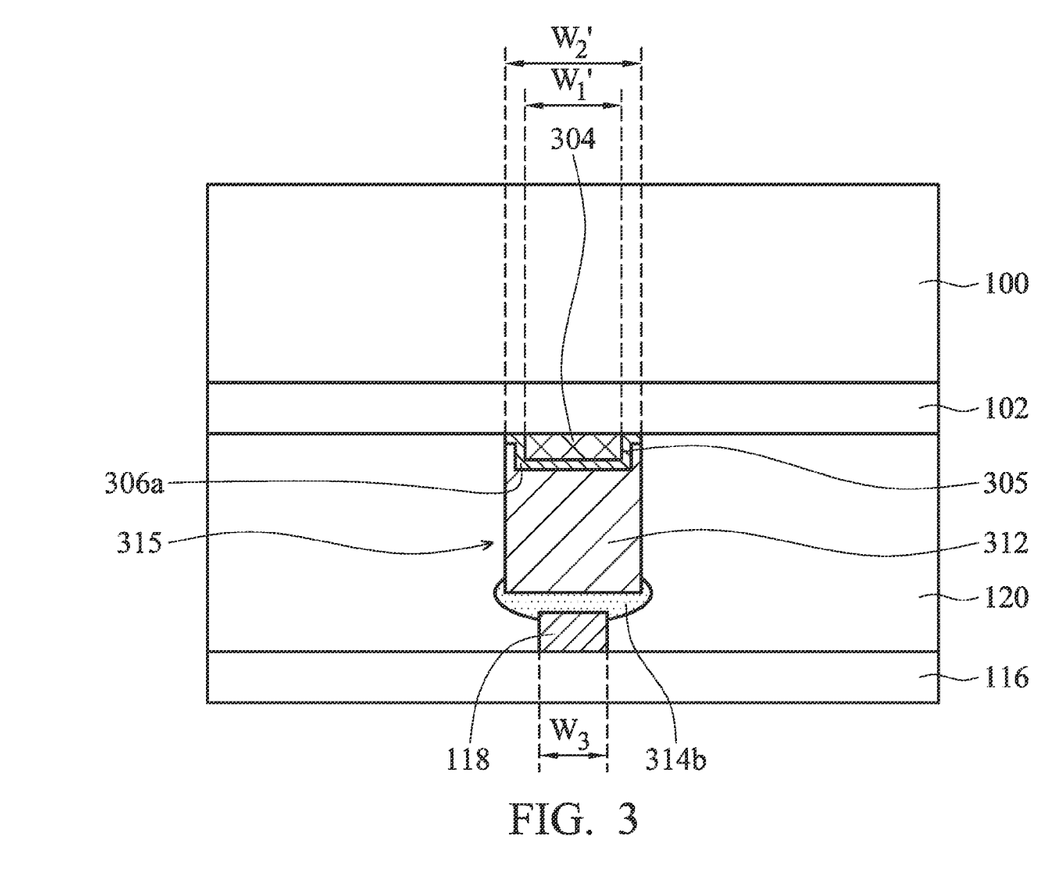
FIG. 3 is a cross-sectional view of a package structure, in accordance with some embodiments.

FIG. 3 is a cross-sectional view of a package structure, in accordance with some embodiments. As shown in FIG. 3, an UBM element 306a, which is wider than the conductive feature 304 thereunder, is formed. In some embodiments, the UBM element 306a extends beyond the conductive feature 304. In some embodiments, the UBM element 306a covers a side surface 305 of the conductive feature 304. In some embodiments, the UBM element 306a further extends over the dielectric layer 102. Because the UBM element 306a is wider than the conductive feature 304, a conductive pillar 312 formed on the UBM element 306a is also wider than the conductive feature 304. As shown in FIG. 3, the width $W_2'$ of the conductive pillar 312 is greater than the width $W_1'$ of conductive feature 304.

In some embodiments, the materials and fabrication methods of the UBM element 306a and the conductive pillar 312 are similar to those of the UBM element 106a and the conductive pillar 112 shown in FIG. 1. For example, by tuning the size and/or the shape of the opening 110 shown in FIG. 1C, the UBM element and the conductive pillar having different sizes and/or shapes may be formed.

As shown in FIG. 3, a solder bump 314b is formed to bond the conductive pillar 312 with the conductive feature 118, in accordance with some embodiments. In some embodiments, the material and fabrication method of the solder bump 314b is similar to those of the solder bump 114b or 214b shown in FIG. 1 or FIG. 2. As shown in FIG. 3, a bonding structure 315, including the UBM element 306a, the conductive pillar 312, and the solder bump 314b, is formed to bond the semiconductor substrate 100 and the substrate 116 together.

In some embodiments, the protection material 120 is not in direct contact with the conductive feature 304, as shown in FIG. 3. In some embodiments, one or more intermediate layers are formed between the conductive feature 304 and the protection material 120. For example, the UBM element 306a is between the conductive feature 304 and the protection material 120.

Embodiments of the disclosure provide a package structure and a method for forming a package structure. The package structure includes two bonded substrates which are bonded with each other through a bonding structure. The bonding structure connects the conductive features (such as conductive pads) over the two substrates together. No passivation layer is formed over the conductive features. Therefore, fabrication time and fabrication cost are significantly reduced.

In accordance with some embodiments, a package structure is provided. The package structure includes a semiconductor substrate and a first conductive feature over the semiconductor substrate. The package structure also includes a substrate and a second conductive feature over the substrate. The second conductive feature is bonded with the first conductive feature through a bonding structure. The package structure further includes a protection material surrounding the bonding structure, and the protection material is in direct contact with a side surface of the first conductive feature.

In accordance with some embodiments, a package structure is provided. The package structure includes a semiconductor substrate and a first conductive feature over the semiconductor substrate. There is no passivation layer on the first conductive feature. The package structure also includes a substrate and a second conductive feature over the substrate. The second conductive feature is bonded with the first conductive feature through a bonding structure.

In accordance with some embodiments, a method for forming a package structure is provided. The method includes forming a first conductive feature over a semiconductor substrate. The method also includes forming a second conductive feature over a substrate. The method further includes bonding the first conductive feature with the second conductive feature through a bonding structure. No passivation layer is formed over the first conductive feature before the bonding structure is formed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
a semiconductor substrate;
a dielectric layer over the semiconductor substrate;
a first conductive feature over the semiconductor substrate, wherein the first conductive feature is in direct contact with a top surface of the dielectric layer without extending below the top surface of the dielectric layer;
a substrate;
a second conductive feature over the substrate, wherein the second conductive feature is bonded with the first conductive feature through a bonding structure, and the bonding structure comprises:
an under-bump metallization element, wherein a stepped portion of the under-bump metallization element adjoins a side surface of the first conductive feature and the top surface of the dielectric layer below the first conductive feature; and
a conductive pillar covering the under-bump metallization element, wherein the stepped portion of the under-bump metallization element separates the conductive pillar from the dielectric layer and is sandwiched between the conductive pillar and the dielectric layer below the first conductive feature; and
a protection material surrounding the bonding structure, wherein the protection material is in direct contact with the stepped portion of the under-bump metallization element.

2. The package structure as claimed in claim 1, wherein the under-bump metallization element is in direct contact with a top surface of the first conductive feature.

3. The package structure as claimed in claim 1, wherein the conductive pillar is partially sandwiched between the stepped portion adjoining the side surface of the first conductive feature and the protection material adjoining the top surface of the dielectric layer.

4. The package structure as claimed in claim 1, wherein the first conductive feature is narrower than the conductive pillar.

5. The package structure as claimed in claim 1, wherein the first conductive feature is narrower than the under-bump metallization element.

6. The package structure as claimed in claim 1, wherein a width ratio of the conductive pillar to the second conductive feature is in a range from about 1.01 to about 2.

7. The package structure as claimed in claim 1, wherein the bonding structure further comprises a solder bump, and the under-bump metallization element and the solder bump, which is in direct contact with a side surface of the second conductive feature, sandwich the conductive pillar.

8. The package structure as claimed in claim 1, wherein the protection material comprises an underfill material.

9. The package structure as claimed in claim 1, wherein there is no passivation layer between the first conductive feature and the protection material.

10. The package structure as claimed in claim 1, wherein there is not any silicon nitride layer, silicon oxide layer, or silicon oxynitride layer between the protection material and the first conductive feature.

11. A package structure, comprising:
a semiconductor substrate;
a dielectric layer over the semiconductor substrate;
a first conductive feature over the semiconductor substrate, wherein there is no passivation layer on the first conductive feature;
a substrate; and
a second conductive feature over the substrate, wherein the second conductive feature is bonded with the first conductive feature through a bonding structure, and the bonding structure comprises:
an under-bump metallization element in direct contact with the first conductive feature and wider than the first conductive feature, wherein a stepped portion of the under-bump metallization element adjoins a side surface of the first conductive feature and a top surface of the dielectric layer below the first conductive feature; and
a conductive pillar over the under-bump metallization element and wider than the first conductive feature, wherein the stepped portion of the under-bump metallization element separates the conductive pillar from the dielectric layer and is sandwiched between the conductive pillar and the dielectric layer below the first conductive feature.

12. The package structure as claimed in claim 11, further comprising a protection material surrounding the bonding structure.

13. The package structure as claimed in claim 12, wherein there is not any silicon nitride layer, silicon oxide layer, or silicon oxynitride layer between the protection material and the first conductive feature.

14. The package structure as claimed in claim 12, wherein the protection material is not in direct contact with the first conductive feature, and the stepped portion of the under-bump metallization element is sandwiched between the protection material and the first conductive feature.

15. The package structure as claimed in claim 12, wherein the protection material is in direct contact with the bonding structure.

16. A method for forming a package structure, comprising:
forming a dielectric layer over a semiconductor substrate;
forming a first conductive feature over the semiconductor substrate, wherein the first conductive feature is in direct contact with a top surface of the dielectric layer without extending below the top surface of the dielectric layer;
forming a second conductive feature over a substrate; and
bonding the first conductive feature with the second conductive feature through a bonding structure, wherein no passivation layer is formed over the first conductive feature before the bonding structure is formed, and the formation of the bonding structure comprises:
forming an under-bump metallization element, wherein a stepped portion of the under-bump metallization element is in direct contact with a side surface of the first conductive feature and the top surface of the dielectric layer, and wherein a side surface of the under-bump metallization element is exposed and is non-coplanar with a side surface of the first conductive feature after bonding the first conductive feature with the second conductive feature; and
forming a conductive pillar covering the under-bump metallization element, wherein the stepped portion of the under-bump metallization element separates the conductive pillar from the dielectric layer and is sandwiched between the conductive pillar and the dielectric layer below the first conductive feature.

17. The method for forming a package structure as claimed in claim 16, further comprising forming a protection material to surround the bonding structure.

18. The method for forming a package structure as claimed in claim 16, wherein the formation of the bonding structure further comprises forming a solder bump over the conductive pillar, and wherein the conductive pillar is sandwiched between the under-bump metallization element and the solder bump, which is in direct contact with a side surface of the second conductive feature.

19. The method for forming a package structure as claimed in claim 16, wherein the formation of the bonding structure further comprises:
forming an under-bump metallization layer over the first conductive feature;
forming a mask layer over the under-bump metallization layer;
forming the conductive pillar over the first conductive feature through an opening of the mask layer;
removing the mask layer; and
removing a portion of the under-bump metallization layer not covered by the conductive pillar to form the under-bump metallization element.

20. The method for forming a package structure as claimed in claim 16, wherein the formation of the bonding structure further comprises:
forming a solder cap over the conductive pillar; and
bonding the solder cap with the second conductive feature.

* * * * *